United States Patent

Yuasa et al.

(10) Patent No.: US 7,511,927 B2
(45) Date of Patent: Mar. 31, 2009

(54) MAGNETORESISTIVE EFFECT ELEMENT, MAGNETIC HEAD AND MAGNETIC REPRODUCING APPARATUS

(75) Inventors: Hiromi Yuasa, Kanagawa-ken (JP); Masatoshi Yoshikawa, Kanagawa-ken (JP); Katsuhiko Koui, Kanagawa-ken (JP); Hitoshi Iwasaki, Kanagawa-ken (JP); Masashi Sahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/282,659

(22) Filed: Nov. 21, 2005

(65) Prior Publication Data

US 2006/0067017 A1    Mar. 30, 2006

Related U.S. Application Data

(62) Division of application No. 10/175,960, filed on Jun. 21, 2002, now Pat. No. 7,218,483.

(30) Foreign Application Priority Data

Jun. 22, 2001    (JP)    ............... 2001-190511

(51) Int. Cl.
*G11B 5/39*    (2006.01)
(52) U.S. Cl. .................................. 360/324.1
(58) Field of Classification Search ............... 362/147; 365/97; 372/45.01; 360/324.1, 324, 324.2, 360/214
See application file for complete search history.

(56) References Cited

U.S. PATENT DOCUMENTS

| | | | |
|---|---|---|---|
| 5,132,749 A | | 7/1992 | Nishibayashi et al. |
| 5,436,754 A | | 7/1995 | Ishihara et al. |
| 5,986,858 A | * | 11/1999 | Sato et al. ............... 360/324.2 |
| 6,272,036 B1 | * | 8/2001 | You et al. ................... 365/97 |
| 6,473,275 B1 | * | 10/2002 | Gill ........................... 360/314 |
| 6,697,405 B2 | * | 2/2004 | Kitatani et al. ........... 372/45.01 |
| 2002/0020892 A1 | | 2/2002 | Shima |
| 2002/0048128 A1 | | 4/2002 | Kamiguchi et al. |
| 2002/0131215 A1 | * | 9/2002 | Beach ..................... 360/324.2 |
| 2003/0011945 A1 | | 1/2003 | Yuasa et al. |
| 2003/0021071 A1 | | 1/2003 | Kula et al. |
| 2003/0021107 A1 | * | 1/2003 | Howell et al. ............. 362/147 |
| 2006/0067017 A1 | | 3/2006 | Yuasa et al. |

FOREIGN PATENT DOCUMENTS

| | | |
|---|---|---|
| JP | 03085762 | 4/1991 |
| JP | 2000-106462 | 4/2000 |
| JP | 2000-200408 | 7/2000 |

* cited by examiner

*Primary Examiner*—Tianjie Chen
(74) *Attorney, Agent, or Firm*—Oblon, Spivak, McClelland, Maier & Neustadt, P.C.

(57) ABSTRACT

A spin valve type magnetoresistive effect element for vertical electric conduction includes a magnetoresistive effect film in which a resistance adjustment layer made of a material containing conductive carriers not more than $10^{22}/cm^3$ is inserted. Thus the resistance value of a portion in change of spin-relied conduction is raised to an adequate value, thereby to increase the resistance variable amount.

4 Claims, 9 Drawing Sheets

MAGNETORESISTIVE EFFECT ELEMENT, MAGNETIC HEAD AND MAGNETIC REPRODUCING APPARATUS

CROSS-REFERENCE TO RELATED APPLICATIONS

This application is a divisional of Application Ser. No. 10/175,960, filed Jun. 21, 2002 now U.S. Pat. No. 7,218,483, and is based upon and claims the benefit of priority from the prior Japanese Patent Application No. 2001-190511, filed on Jun. 22, 2001; the entire contents of both are incorporated herein by reference.

BACKGROUND OF THE INVENTION

This invention relates to a magnetoresistive effect element, magnetic head and magnetic recording apparatus, and more particularly, to a magnetoresistive effect element structured to flow a sense current perpendicularly of the film surface of a magnetoresistive effect film, as well as a magnetic head and a magnetic reproducing apparatus using the magnetoresistive effect element.

Read-out of information recorded in a magnetic recording medium conventionally relied on a method of moving a reproducing magnetic head having a coil relative to the recording medium and detecting a current induced in the coil by electromagnetic induction then generated. Later, a magnetoresistive effect element was developed, and has been brought into practical use as a magnetic field sensor as well as a magnetic head (MR head) incorporated in a magnetic reproducing apparatus such as a hard disk drive.

For years, magnetic recording mediums have been progressively downsized and enhanced in capacity, and the relative speed between the reproducing magnetic head and the magnetic recording medium during information read-out operation has been decreased accordingly. Under the circumstances, there is the increasing expectation for MR heads capable of extracting large outputs even with small relative speeds.

As an answer to the expectation, it has been reported that multi-layered films, so called an "artificial lattice films", which are made by alternately depositing ferromagnetic metal films and nonmagnetic metal films, such as the combination of Fe layers and Cr layers or the combination of Fe layers and Cu layers, under certain conditions, and bringing closely located ferromagnetic metal films into antiferromagnetic coupling, exhibit giant magnetoresistive effects (see Phys. Rev. Lett. 61 2474 (1988), Phys. Rev. Lett., vol. 64, p2304 (1990), for example). Artificial films, however, need a large magnetic field for magnetic saturation, and are not suitable as film materials for MR heads.

On the other hand, there are reports about realization of a large magnetoresistive effect by using a multi-layered film of the sandwich structure of a ferromagnetic layer on a nonmagnetic layer and a ferromagnetic layer even when the ferromagnetic layer is not under ferromagnetic coupling. According to this report, one of two layers sandwiching the nonmagnetic layer is fixed in magnetization beforehand by application of an exchanging bias magnetic field thereto, and the other ferromagnetic layer is magnetically reversed with an external magnetic field (signal magnetic field, for example). It results in changing the relative angle between the magnetization directions of these two ferromagnetic layers on opposite surfaces of the nonmagnetic layer, and exerting a large magnetoresistive effect. The multi-layered structure of this kind is often called "spin valve" (see Phys. Rev. B, vol. 45, p806 (1992), J. Appl. Phys., vol. 69, p 4774) (1981) and others).

Spin valves that can be magnetically saturated under a low magnetic field are suitable as MR heads and are already brought into practical use. However, their magnetoresistive variable rates are only 20% maximum. Therefore, to cope with area recording densities not lower than 100 Gbpsi (gigabit per square inch), there is the need of a magnetoresistive effect element having a higher magnetoresistance variable rate.

As its substitutional technique, a TMR (tunneling magnetoresistance) element has been proposed. The TMR element makes use of the phenomenon that spin-polarized electrons tunnel through an insulating barrier layer, and it exhibits an excellent magnetoresistance variable rate as high as 50% or more. However, to satisfy the magnetoresistance variable rate as high as 30%, for example, the area resistivity of the element becomes as high as 100 $\Omega\mu m^2$. Since reproducing heads for handling area recording densities not lower than 100 Gbpsi need downsizing the device area to a level not smaller than 0.1 $\mu m^2$, resistance of the TMR element increases to 1 k$\Omega$ or higher, and results in decreasing S/N. To the contrary, if the resistance is lowered to about 10 $\Omega\mu m^2$, then the magnetoresistance variable rate also decreases to about 10%. Therefore, there is no clear prospect toward its practical use.

Structures of magnetoresistive effect elements are classified into CIP (current-in-plane) type structures permitting a sense current to flow in parallel to the film plane of the element and CPP (current-perpendicular-to-plane) type structures permitting a sense current to flow perpendicularly to the film plane of the element. Considering that CPP type magnetoresistive effect elements were reported to exhibit magnetoresistance variable rates as large as approximately ten times those of CIP type elements (J. Phys. Condens. Mater., vol. 11, p. 5717 (1999) and others), realization of the magnetoresistance variable rate of 100% is not impossible.

However, CPP type elements having been heretofore reported mainly use artificial lattices, and a large total thickness of films and a large number of boundary faces caused a large variation of resistance (output absolute value). To realize a satisfactory magnetic property required for a head, the use of a spin valve structure is desirable.

FIG. 16 is a cross-sectional view that schematically showing a CPP type magnetoresistive effect element having a spin valve structure. A magnetoresistive effect film M is interposed between an upper electrode 52 and a lower electrode 54, and a sense current flows perpendicularly to the film plane. The magnetoresistive effect film M shown here has the basic film structure sequentially made by depositing a base layer 12, antiferromagnetic layer 14, magnetization-fixed layer 16, nonmagnetic intermediate layer 18, magnetization free layer 20 and protective layer 22 on the lower electrode 54.

As these layers are made of metals. The magnetization-fixed layer (called pinned layer) is a magnetic layer in which magnetization is fixed substantially in one direction. The magnetization free layer 20 (called free layer) is a magnetic layer in which the direction of magnetization can freely change depending upon an external magnetic field.

This kind of spin valve structure, however, has a smaller total thickness and fewer boundary faces than those of artificial lattices. Therefore, if a current is supplied perpendicularly to the film plane, then the area resistivity AR becomes as small as the order of tens of m$\Omega\mu m^2$. Of this resistance, the resistance of the active portion in charge of changes of the magnetoresistance is approximately 1 through 2 m$\Omega\mu m^2$. As a result, even if the magnetoresistance variable rate is 50%, the area resistivity variable rate AΔR obtained is as small as 0.5 mΩμm², approximately.

BRIEF SUMMARY OF THE INVENTION

According to an embodiment of the invention, there is provided a magnetoresistive effect element comprising: a magnetoresistive effect film including a magnetization-pinned layer having a magnetic film whose direction of magnetization is pinned substantially in one direction, a magnetization free layer having a magnetic film whose direction of magnetization varies in response to an external magnetic field, a nonmagnetic metallic intermediate layer interposed between the magnetization-pinned layer and the magnetization free layer, and a resistance adjustment layer interposed between the magnetization-pinned layer and the magnetization free layer and made of a material containing a quantity of conductive carriers not more than $10^{22}/cm^3$; and a pair of electrodes electrically coupled to the magnetoresistive effect film to supply a sense current substantially vertically of the film plane of the magnetoresistive effect film.

According to another embodiment of the invention, there is provided a magnetoresistive effect element comprising: a magnetoresistive effect film including a magnetization-pinned layer having a magnetic film whose direction of magnetization is pinned substantially in one direction, a magnetization free layer having a magnetic film whose direction of magnetization varies in response to an external magnetic field, and a nonmagnetic metallic intermediate layer interposed between said magnetization-pinned layer and said magnetization free layer; a pair of electrodes electrically coupled to said magnetoresistive effect film to supply a sense current substantially vertically of the film plane of said magnetoresistive effect film, wherein said nonmagnetic intermediate layer is a resistance adjustment layer made of a material containing conductive carriers not more than $10^{22}/cm^3$.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Some embodiments of the invention will now be explained below with reference to the drawings.

FIRST EMBODIMENT

Explanation is started with the first embodiment of the invention which is a configuration including a resistance adjustment layer made of a semiconductor or a semimetal.

Figure 1:
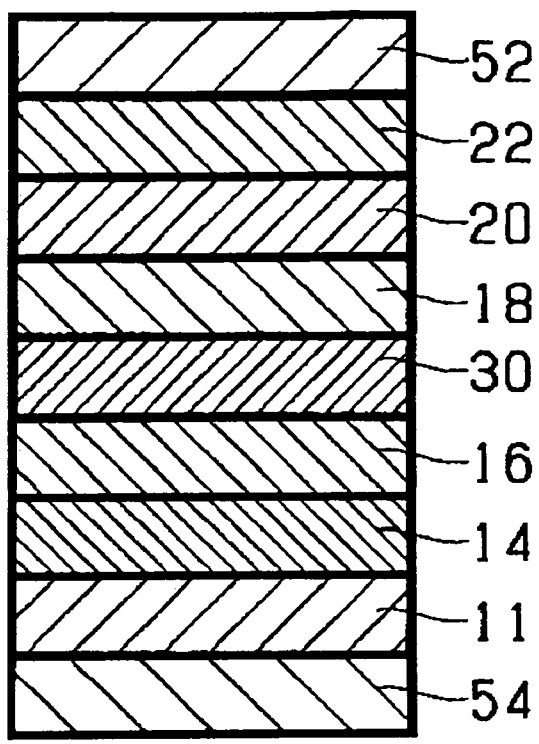
FIG. 1 is a schematic diagram that shows a cross-sectional structure of the substantially part of a magnetoresistive effect element according to the first embodiment of the invention.

FIG. 1 is a schematic diagram that shows a cross-sectional structure of the substantially part of a magnetoresistive effect element according to the first embodiment. More specifically, the magnetoresistive effect element according to the embodiment has a structure made by sequentially depositing a base layer 12, resistance adjustment layer 30, nonmagnetic intermediate layer 18, free layer 20, protective layer 22 and upper electrode 52 on a lower electrode 54.

In the illustrated magnetoresistive effect element, it is the portion of the pinned layer 16, nonmagnetic intermediate layer 18 and free layer 20 that takes charge of the magnetoresistive effect. That is, in this portion, a resistance depending upon spins is generated against spin-polarized electrons. That is, a spin-relied resistance is generated. In order to fabricate a magnetoresistive effect element enhanced in device output, i.e. absolute value of the magnetoresistance variable amount, to a degree acceptable for practical use, it is effective to increase the resistance value of the portion having the spin-relied resistance.

To obtain a large output in a CPP type spin valve structure, it is important to adequately improve the resistance of the portion in charge of spin-relied conduction and thereby increase the resistance variable amount. In this case, from the viewpoint of S/N and heat evolution issues, resistance of the magnetoresistive effect element is preferably around hundreds of mΩμm².

Taking it into consideration, in the instant embodiment of the invention, the resistance adjustment layer 30, in which the concentration of electrons or other carriers for conduction is inherently lower than those of metals, namely, not higher than approximately $10^{22}$ cm$^{-3}$, is inserted in the portion in charge of the magnetoresistance, and the resistance is increased adequately.

Preferable materials of this kind of resistance adjustment layer 30 are semiconductors or semimetals. Unlike the insulating barrier layer of a TMR element, the resistance adjustment layer 30 used in the embodiment of the invention and made of such a material contain conduction carriers, and can therefore overcome the problem of an excessive increase of the device resistivity by adjusting the thickness of the film.

In case spin-polarized electrons are injected into a nonmagnetic material (metal, semimetal, semiconductor), since the spins do not relax and remain conductive within the spin diffusion length, it is effective for increasing the magnetoresistance variable amount.

That is, the embodiment of the invention can appropriately increase the resistance of the magnetoresistive effect element and can enhance its output.

Respective components forming the magnetoresistive effect element according to the embodiment of the invention will be explained below.

The base layer 12 is preferably made of a material having the function of improving the crystal properties of the overlying free layer 20 and the pinned layer 16 as well as the function of smoothing boundaries. For example, Ni—Fe—Cr alloy containing Cr by approximately 40% is one of such materials. For the purpose of ensuring better orientation, a layer (not shown) of NiFe, Ru or Cu, for example, may be inserted between the base layer 12 and the antiferromagnetic layer 14.

The antiferromagnetic layer 14 functions to fix magnetization of the pinned layer 16. That is, by locating the antiferromagnetic layer 14 made of PtMn, IrMn, PdPtMn, NiMn, or the like, adjacent to the pinned layer 16, magnetization of the pinned layer 16 can be fixed in one direction by making use of the exchanging coupling bias magnetic field generated along the interface.

To enhance the effect of fixing magnetization of the pinned layer 16, a magnetically coupling intermediate layer (not shown) is preferably inserted between the antiferromagnetic layer 14 and the pinned layer 16. Ferromagnetic alloys containing Fe, Co or Ni, for example, as their major components are usable as the material of the magnetically coupling intermediate layer. Its thickness must be very thin, namely, as thin as 0.1 through 3 nm, for restricting magnetization of the pinned layer 16.

For the purpose of stabilizing the fixed magnetization, a so-called synthetic type multi-layered structure that is a ferri-type multi-layered of a ferromagnetic layer, anti-parallel coupling layer and ferromagnetic layer employed in spin-valve GMR is also preferable as the magnetically coupling intermediate layer.

Figure 2:
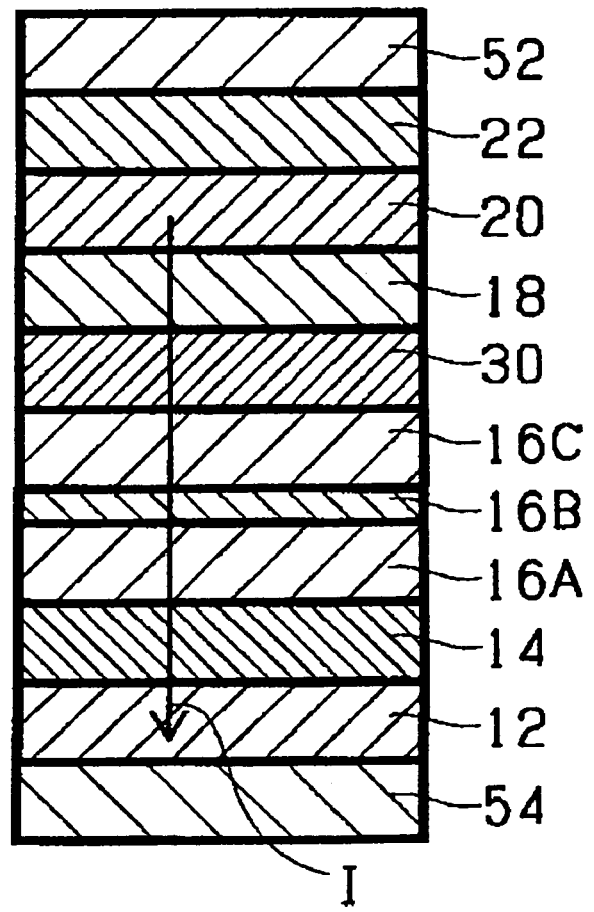
FIG. 2 is a schematic diagram that shows a cross-sectional structure of a magnetoresistive effect element having a synthetic type pinned layer.

FIG. 2 is a schematic diagram that shows a cross-sectional structure of a magnetoresistive effect element having a synthetic type pinned layer. Here are formed a first ferromagnetic layer 16A, anti-parallel coupling layer 16B and second ferromagnetic layer 16C as the pinned layer 16. The anti-parallel coupling layer 16B has the role of coupling the upper and lower ferromagnetic layers in an anti-parallel magnetization direction, and Ru (ruthenium) can be used as its material. In the synthetic multi-layered structure, upper and lower ferromagnetic layers are brought into antiferromagnetic coupling via the anti-parallel coupling layer 16B.

The resistance adjustment layer 30 has the role of appropriately increasing the resistance value of a part of the magnetoresistive effect element, which has a spin-relied resistance, as already referred to. For this purpose, the resistance adjustment layer 30 is preferably made of a material inherently having a lower concentration of electrons or other carriers in charge of conduction that those of metals, namely, not higher than approximately $10^{22}$ cm$^{-3}$. Semiconductors or semimetals are appropriate as such materials.

When using semiconductor materials, such as C, Si, Ge, AlN, GaN, InN, AlP, AlAs, AlSb, GaP, GaAs, GaSb, InP, InAs, InSb, ZnO, β-ZnS, ZnSe, ZnTe, CdS, CdTe, HgTe, α-SiC, β-SiC, PbS, PbSe, PbTe, SnTe, SnTe, CuInSe$_2$, FeSi$_{2.43}$, β-FeSi$_2$, MnSi$_{1.72}$, CrSe$_2$, (Cr$_{1-x}$Mn$_x$)Si$_2$, Mg$_2$Si, BaSi$_2$, ReSi$_{1.75}$, RuSi$_3$, OsSi$_2$, Ir$_3$Si$_5$, etc., the tendency of increasing the output was observed.

However, semiconductors generally exhibit slightly higher specific resistance values as high as several Ωcm to 1 kΩcm. If, for example, a 1 nm thick layer of a semiconductor having the specific resistance of 10 Ωcm is inserted, then the device resistivity AR rises to 10 Ωμm$^2$, which is about a hundred times of appropriate values around hundreds of mΩμm$^2$.

In contrast, the use of semimetals having lower resistance values is effective for decreasing the resistance. Examples of such semimetals are graphite, As, Sb, Bi, HgTe, HgSe, CoSi, (Co$_{1-x}$Fe$_x$)Si, (Co$_{1-x}$Ni$_x$)Si, (Co$_{1-x}$Mn$_x$)Si, (Co$_{1-x}$Cr$_x$)Si and FeSi. These semimetals are relatively low in specific resistance, ranging from a lower value around 40 μΩcm of Sb to a higher value around 1 mΩcm. Therefore, they need not be thinned for the purpose of adjusting the device resistivity. However, from the viewpoint of preventing relaxation of spins in the layer, the thickness of such a semimetal is preferably limited not to exceed 1 nm.

The nonmagnetic intermediate layer 18 has the role of interrupting magnetic coupling between the pinned layer 16 and the free layer 20. It is desirable that the nonmagnetic intermediate layer 18 also functions to improve the interface between the nonmagnetic intermediate layer 18 and the pinned layer 16 such that the up-spin electrons flowing from the pinned layer 16 to the free layer 20 are not scattered. Possible materials of the nonmagnetic intermediate layer 18 are, for example, Cu, Au, Ag, Ru, Ir, Pd, Cr, Mg, Al, Rh, Pt, and so on. The layer 18 should be thick enough to sufficiently interrupt magnetic coupling between the free layer 20 and the pinned layer 16 and thin enough to prevent scattering of the up-spin electrons from the pinned layer 16. Namely, the thickness is preferably in the range from 0.5 to 5 nm, although depending upon its material. The free layer 20 is a magnetic layer in which the direction of magnetization changes with an external signal magnetic field. Usable materials thereof are, for example, CoFe, NiFe and CoFeNi alloys. If these alloys additionally contain any of Sc, Ti, Mn, Cu, Zn, Ga, Ge, Zr, Hf, Y, Tc, Re, Ru, Rh, Ir, Pd, Pt, Ag, Au, B, Al, In, C, Si, Ca, Sr, etc., they will ensure higher outputs.

A multi-layered structure of these alloys is also usable. Examples of such multi-layered structures are NiFe/CoFe, CoFe/NiFe, NiFe/CoFe/NiFe, CoFe/NiFe/CoFe, and so forth.

Also usable as the free layer 20 is a multi-layered structure of any of those alloys and a nonmagnetic layer. Examples of such multi-layered structures are CoFe/Cu/CoFe, NiFe/CoFe/Cu/CoFe/NiFe, etc. In this case, Co-system alloys, which enhance scattering at interfaces with nonmagnetic layers, are hopeful as enhancing the effect of lamination with nonmagnetic layers than Ni-system alloys.

The total thickness of the free layer 20 is preferably in a range between 0.5 through 7 nm.

The protective layer 22 has the role of protecting the multi-layered structure of the magnetoresistive effect film during patterning and other processing.

Figure 16:
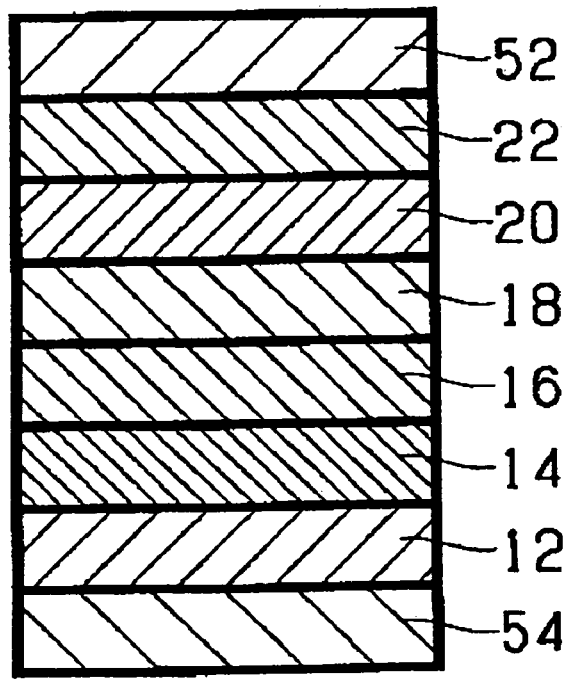
FIG. 16 is a cross-sectional view that schematically shows a CPP type magnetoresistive effect element having a spin valve structure.

The Inventors prepared magnetoresistive effect elements A1, A2 and A3 of the synthetic structure shown in FIG. 2, and compared them with a magnetoresistive effect element A0 of the conventional structure shown in FIG. 16.

Materials and thicknesses of respective layers forming the prepared magnetoresistive effect elements are listed below.

| <Magnetoresistive effect elements A0, A1, A2, A3> | | |
|---|---|---|
| Protective layer 22 | Ta | (5 nm) |
| Second free layer 20 | $(Co_{86}Fe_{14})_{82}Ni_{18}$ | (4 nm) |
| First free layer 20 | $(Fe_{50}Co_{50})_{95}Cu_5$ | (2 nm) |
| Nonmagnetic intermediate layer 18 | Cu | (3 nm) |
| Pinned layer 16C | $(Fe_{50}Co_{50})_{95}Cu_5$ | (3 nm) |
| Pinned layer 16B | Ru | (1 nm) |
| Pinned layer 16A | $Co_{90}Fe_{10}$ | (3 nm) |
| Antiferromagnetic layer 14 | PtMn | (15 nm) |
| Second base layer 12 | Ru | (2 nm) |
| First base layer 12 | Ta | (5 nm) |

The prepared magnetoresistive effect elements A0, A1, A2 and A3 were common in the above-indicated structure. The free layer 20 used here was a multi-layered structure of the first and second nonmagnetic layers. The pinned layer 16 was a synthetic structure stacking two kinds of ferromagnetic layers on opposite surfaces of a Ru (ruthenium) layer. The base layer 12 was formed as a two-layered structure.

In the magnetoresistive effect elements A1, A2 and A3 according to the embodiment of the invention, a resistance adjustment layer 30 was inserted between the pinned layer 16 and the nonmagnetic intermediate layer 18 as shown in FIG. 2. Material and thickness of the resistance adjustment layer 30 in each element were as follows.

| <Magnetoresistive effect element A1> | | |
|---|---|---|
| Resistance adjustment layer 30 | GaAs | (1 nm) |
| <Magnetoresistive effect element A2> | | |
| Resistance adjustment layer 30 | CoSi | (1 nm) |
| <Magnetoresistive effect element A3> | | |
| Resistance adjustment layer 30 | $(Fe_{10}Co_{90})Si$ | (1 nm) |

For preparing those magnetoresistive effect elements, the following two kinds of process were carried out.

The first process of preparation is explained below.

$AlO_x$ is deposited on a Si (silicon) substrate to form a 500 nm thick film, and a resist is coated thereon. A part of the resist in the region for the lower electrode is removed by PEP (photo engraving process). After that, a part of $AlO_x$ in the region without the resist is removed by RIE (reactive ion etching), and a multi-layered structure of Ta (5 nm)/Cu (400 nm) is formed as the lower electrode 54.

After that, the surface is smoothed by CMP (chemical mechanical polishing) to the surface of $AlO_x$ not covered by the resist on the surface. Then a magnetoresistive effect film sized 3×3 µm² to 5×5 µm² is formed thereon, and a hard bias applying film made of CoPt is formed on side surfaces thereof up to the thickness of 30 nm.

After that, 200 nm thick $SiO_x$ is deposited as a passivation film, and a resist is coated. Then the resist is partly removed from the region for making a contact hole in a central area of the spin valve, and after etching by RIE, the resist is removed entirely. Thereafter, etching by ion milling is carried out for removal of carbides. After that, a multi-layered structure of Ta (5 nm)/Cu (400 nm)/Ta (5 nm) is formed as the upper electrode 52, and an electrode pad of 200 nm thick Au (gold) is formed, thereby to complete the substantial part of the magnetoresistive effect element.

The second process of preparation is next explained below.

First formed on a thermal oxide Si substrate is the lower electrode 54 (Ta 5 nm/Cu 300 nm/Ta (20 nm) by using a metal mask. Still using the metal mask, a magnetoresistive effect film is formed thereon. When PtMn is used as the antiferromagnetic layer 14, the structure is annealed in a magnetic field at 270° C. for 10 hours, thereby to fix the magnetization of the pinned layer 16. Area of the magnetoresistive effect film is determined as large as approximately 2 mmφ, taking the magnetic property into consideration.

After that, $SiO_x$ is deposited on the entire substrate surface to form a 200 nm thick film, and a resist is coated. The resist is partly removed from the region for the contact hole in a central portion of the spin valve, and after etching by RIE, the resist is removed entirely. After that, milling is carried out for removal of carbides. Thereafter, the upper electrode 52 (Ta 5 nm/Cu 400 nm/Au 200 nm) and the electrode pad are formed by using a metal mask, thereby to complete the substantial part of the magnetoresistive effect element.

With the magnetoresistive effect elements prepared by those two kinds of processes explained above, their electric resistance properties were measured by the four-terminal technique. As a result, no difference in magnetoresistance variable amount AΔR was observed. Therefore, in the explanation given below, representative values of device characteristics will be shown without specifying the process.

Resistance of the spin valve film in the magnetoresistive effect element A0 taken as the comparative example was AR=40 mΩµm².

On the other hand, GaAs used in the magnetoresistive effect element A1 was added with Si donor in the amount to adjust the specific resistance to about 10 Ωcm in an n-type semiconductor. However, the device resistivity still tended to increase, and thickness was thinned as far as possible, namely to 1 nm. Lattice constant of GaAs is 5.653 angstrom, which is approximately twice the lattice constant of $(Fe_{50}CO_{50})_{95}Cu_5$, and it is advantageous for easier attainment of lattice matching.

On the other hand, CoSi and $(Fe_{10}Co_{90})Si$ inserted in the magnetoresistive effect elements A2, A3 are both n-type semimetals, having electron concentrations around $1×10^{20}$ cm$^{-3}$ and $2×10^{20}$ cm$^{-3}$ and specific resistance values around 150 µΩcm and 600 µΩcm, respectively. Here is no need of accounting an excessive increase of the device resistivity; however, in order to ensure spin-polarized electrons to move from the ferromagnetic material without being relaxed, the resistance adjustment layer 30 had better be thin, and its thickness was adjusted to 1 nm.

As a result of measurement of the area resistivity variable amount AΔR of each magnetoresistive effect element, the following values were obtained.

| Magnetoresistive effect element | AΔR |
|---|---|
| A0 | 1.8 mΩµm² |
| A1 | 200 mΩµm² |
| A2 | 80 mΩµm² |
| A3 | 125 mΩµm² |

As apparent also from the result shown above, the magnetoresistive effect element according to the embodiment of the invention can attain resistance variable amounts as large as a hundred times or more of those of conventional elements, and enables significant improvement of sensitivity.

Figure 3:
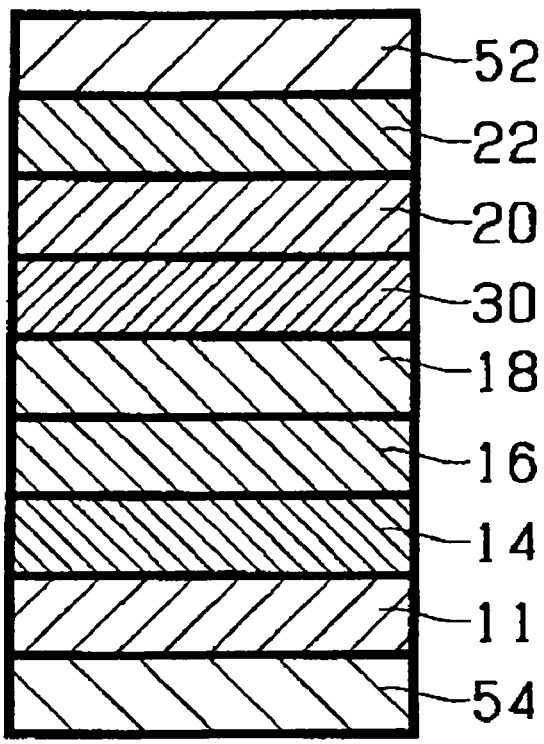
FIG. 3 is a schematic diagram that shows a modification of the first embodiment.

FIG. 3 is a schematic diagram that shows a modification of the same embodiment. Some of components shown here, which are common to those of FIGS. 1 and 2, are labeled with common reference numerals, and their detailed explanation is omitted here.

In this modification, films are stacked in the order of the lower electrode 54, base layer 12, antiferromagnetic layer 14, pinned layer 16, nonmagnetic intermediate layer 18, resistance adjustment layer 30, free layer 20, protective layer 22 and upper electrode 52. Also when the resistance adjustment layer 30 is located between the nonmagnetic intermediate layer 18 and the free layer 20, the same effect is obtained.

SECOND EMBODIMENT

As the second embodiment of the invention, next explained is a magnetoresistive effect element having an insulating layer for enhancing the injection efficiency of spin electrons into the resistance adjustment layer 30.

Figure 4:
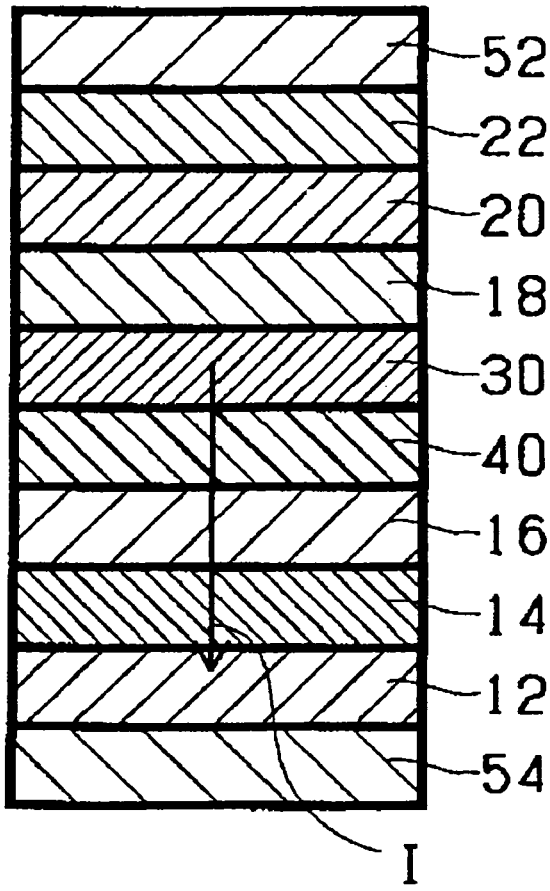
FIG. 4 is a schematic diagram that shows a cross-sectional structure of the substantial part of a magnetoresistive effect element according to the second embodiment of the invention.

FIG. 4 is a schematic diagram that shows a cross-sectional structure of the substantial part of the magnetoresistive effect element according to the second embodiment. Some of components shown here, which are common to those of FIGS. 1 to 3, are labeled with common reference numerals, and their detailed explanation is omitted here.

The magnetoresistive effect element according to the instant embodiment has a structure made by sequentially stacking on the lower electrode 54 the base layer 12, antiferromagnetic layer 14, pinned layer 16, insulating layer 40, resistance adjustment layer 30, nonmagnetic intermediate layer 18, free layer 20, protective layer 22 and upper electrode 52.

In this embodiment, the sense current I is supplied from the upper electrode 52 in the arrow-marked direction toward the lower electrode 54. That is, electrons flow from the upper electrode 54 toward the upper electrode 52.

The insulating layer 40 functions to enhance the efficiency of injecting electrons having spins into the resistance adjustment layer 30. That is, a layer made of an insulator and inserted between the pinned layer 16 made of a ferromagnetic material and the resistance adjustment layer 30 made of a semiconductor or semimetal improves the injection efficiency of spin electrons.

In this case, in order to ensure a higher injection efficiency of spin electrons, an insulator as clean as possible is preferably used as the insulating layer 40 (Phys. Rev. Lett. 68, 1387 (1992)).

Unlike a TMR element, the instant embodiment does not rely on a tunneling barrier function of the insulating layer 40. Instead, the insulating layer 40 is preferably thinned to lower its barrier height and thereby prevent an excessive increase of the device resistivity.

The Inventors prepared magnetoresistive effect elements B1, B2 and B3 based on the structure shown in FIG. 4, and reviewed them in comparison with the magnetoresistive effect element A3 according to the first embodiment.

Materials and thicknesses of respective layers forming the prepared magnetoresistive effect elements are listed below.

| <Magnetoresistive effect elements A3, B1, B2, B3> | | |
|---|---|---|
| Protective layer 22 | Ta | (5 nm) |
| Second free layer 20 | $(Co_{86}Fe_{14})_{82}Ni_{18}$ | (4 nm) |
| First free layer 20 | $(Fe_{50}Co_{50})_{95}Cu_5$ | (2 nm) |
| Nonmagnetic intermediate layer 18 | Cu | (3 nm) |
| Resistance adjustment layer 30 | $(Fe_{10}Co_{90})Si$ | (1 nm) |
| Pinned layer 16C | $(Fe_{50}Co_{50})_{95}Cu_5$ | (3 nm)] |
| Pinned layer 16B | Ru | (1 nm) |
| Pinned layer 16A | $Co_{90}Fe_{10}$ | (3 nm) |
| Antiferromagnetic layer 14 | PtMn | (15 nm) |
| Second base layer 12 | Ru | (2 nm) |
| First base layer 12 | Ta | (5 nm) |

The prepared magnetoresistive effect elements A3, B1, B2 and B3 were common in the above-indicated structure. Here again, the free layer 20 was a multi-layered structure of the first and second nonmagnetic layers. The pinned layer 16 was a synthetic structure stacking two kinds of ferromagnetic layers on opposite surfaces of a Ru (ruthenium) layer. The base layer 12 was formed as a two-layered structure.

Further, in the magnetoresistive effect elements B1, B2 and B3 according to the instant embodiment, an insulating layer 40 was inserted between the pinned layer 16 and the resistance adjustment layer 30 as shown in FIG. 4. Contents of the insulating layer 40 in each element were as follows.

| <Magnetoresistive effect element B1> | |
|---|---|
| Insulating layer 40 | $NiO_x$ |
| <Magnetoresistive effect element B2> | |
| Insulating layer 40 | $TaO_x$ |
| <Magnetoresistive effect element B3> | |
| Insulating layer 40 | $AlO_x$ |

For the purpose of preventing an excessive increase of the device resistivity, these oxides used as the insulating layer 40 were formed as extremely thin insulating layers by forming metal layers of the one-atom thickness to the two-atom thickness and then oxidizing them. As their materials, those forming relatively low barrier heights to electrons were selected.

Also in this embodiment, no significant difference in device property was observed between the two kinds processes of preparation explained in conjunction with the first embodiment.

As a result of measurement of magnetoresistance variable amounts AΔR of the respective magnetoresistive effect elements, the following values were obtained.

| Magnetoresistive effect element | AΔR |
|---|---|
| A3 | 125 mΩμm² |
| B1 | 500 mΩμm² |
| B2 | 800 mΩμm² |
| B3 | 700 mΩμm² |

As apparent also from the result shown above, the magnetoresistive effect element according to the instant embodiment can attain resistance variable amounts as large as several times or more of those according to the first embodiment, and enables significant improvement of sensitivity.

Figure 5:
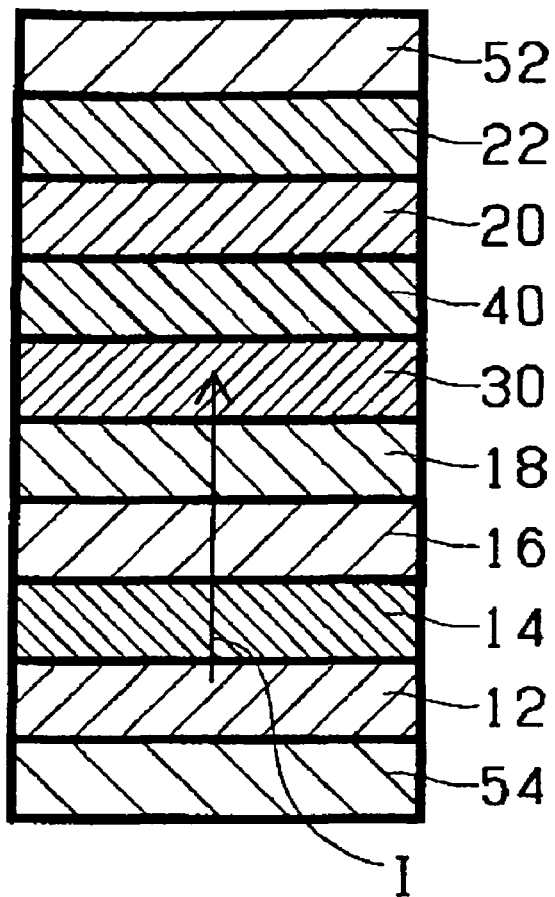
FIG. 5 is a schematic diagram that shows a modification of the second embodiment.

FIG. 5 is a schematic diagram that shows a modification of the second embodiment. Some of components shown here, which are common to those of FIGS. 1 to 4, are labeled with common reference numerals, and their detailed explanation is omitted here.

This modification is so modified that the direction of the sense current I is reversed to flow from the lower electrode 54 toward the upper electrode 54. In this case, the respective layers of the element are stacked in the order of, from the bottom, the lower electrode 54, base layer 12, antiferromagnetic layer 14, pinned layer 16, nonmagnetic intermediate layer 18, resistance adjustment layer 30, insulating layer 40, free layer 20, protective layer 22, and upper electrode 52. In this manner, by locating the insulating layer 40 upstream of the spin electrons injected to the resistance adjustment layer 30, depending upon the direction of the sense current I, substantially the same effect of improving the injection efficiency can be obtained.

THIRD EMBODIMENT

As the third embodiment of the invention, next explained is a magnetoresistive effect element commonly using a layer of a semiconductor or semimetal commonly as a resistance adjustment layer and a nonmagnetic intermediate layer.

Figure 6:
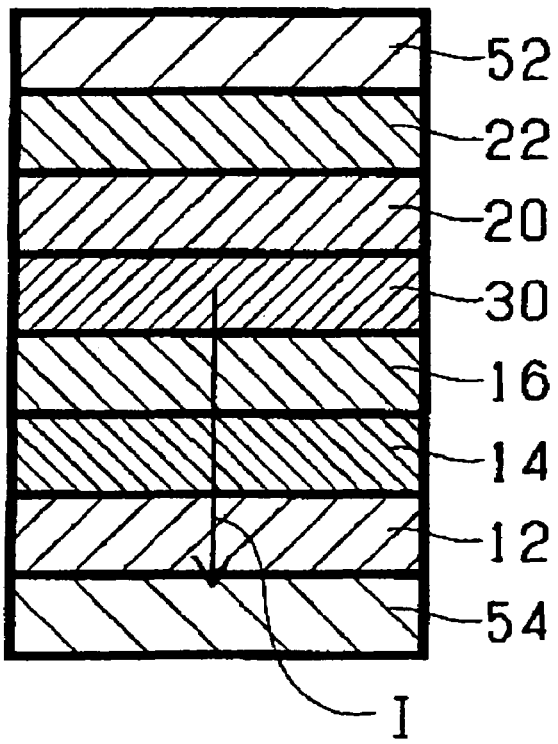
FIG. 6 is a schematic diagram that shows a cross-sectional structure of the substantial part of a magnetoresistive effect element according to the third embodiment of the invention.

FIG. 6 is a schematic diagram that shows a cross-sectional structure of the substantial part of the magnetoresistive effect element according to the third embodiment. Some of components shown here, which are common to those of FIGS. 1 to 4, are labeled with common reference numerals, and their detailed explanation is omitted here.

The magnetoresistive effect element according to the instant embodiment has a structure made by sequentially stacking on the lower electrode 54 the base layer 12, antiferromagnetic layer 14, pinned layer 16, resistance adjustment layer 30, free layer 20, protective layer 22 and upper electrode 52. The resistance adjustment layer 30 used here also functions as a nonmagnetic intermediate layer as well.

The common use of the resistance adjustment layer also as the nonmagnetic intermediate layer reduces the number of hetero interfaces having a high probability of spin-flip, and thereby minimizes the loss of spin electrons to enhance the output. However, in order that the nonmagnetic intermediate layer completes its role of interrupting magnetic coupling between the pinned layer 16 and the free layer 20, it must be thick to a certain degree. Therefore, a semiconductor or a semimetal having a relatively low specific resistance is preferably used as the material of the resistance adjustment layer 30 in this embodiment such that the resistance does not increase excessively even when the film becomes somewhat thick.

The Inventors prepared magnetoresistive effect elements C1, C2 and C3 based on the structure shown in FIG. 6, and measured their outputs.

Materials and thicknesses of respective layers forming the prepared magnetoresistive effect elements are listed below.

| <Magnetoresistive effect elements C1, C2, C3> | | |
|---|---|---|
| Protective layer 22 | Ta | (5 nm) |
| Second free layer 20 | $(Co_{86}Fe_{14})_{82}Ni_{18}$ | (4 nm) |
| First free layer 20 | $(Fe_{50}Co_{50})_{95}Cu_5$ | (2 nm) |
| Pinned layer 16C | $(Fe_{50}Co_{50})_{95}Cu_5$ | (3 nm) |
| Pinned layer 16B | Ru | (1 nm) |
| Pinned layer 16A | $Co_{90}Fe_{10}$ | (3 nm) |
| Antiferromagnetic layer 14 | PtMn | (15 nm) |
| Second base layer 12 | Ru | (2 nm) |
| First base layer 12 | Ta | (5 nm) |

The layers shown above are the same as those of the magnetoresistive effect elements A1 through A3 and B1 through B3 according to the first and second embodiments. Here again, the free layer 20 was a multi-layered structure of the first and second nonmagnetic layers. The pinned layer 16 was a synthetic structure stacking two kinds of ferromagnetic layers on opposite surfaces of a Ru (ruthenium) layer. The base layer 12 was formed as a two-layered structure.

The resistance adjustment layer 30 also serving as the nonmagnetic intermediate layer was inserted between the pinned layer 16 and the free layer. Material and thickness of the resistance adjustment layer 30 in each element were as follows.

| <Magnetoresistive effect element C1> | | |
|---|---|---|
| Resistance adjustment layer 30 | GaAs | (2 nm) |
| <Magnetoresistive effect element C2> | | |
| Resistance adjustment layer 30 | CoSi | (3 nm) |
| <Magnetoresistive effect element C3> | | |
| Resistance adjustment layer 30 | $(Fe_{10}Co_{90})Si$ | (3 nm) |

To accomplish the role of the nonmagnetic intermediate layer to interrupt magnetic coupling between the pinned layer 16 and the free layer 20, the thickness was adjusted in the range from 2 to 3 nm.

Also in this embodiment, no significant difference in device property was observed between the two kinds processes of preparation explained in conjunction with the first embodiment.

As a result of measurement of magnetoresistance variable amounts AΔR of the respective magnetoresistive effect elements, the following values were obtained.

| Magnetoresistive effect element | AΔR |
|---|---|
| C1 | 300 m$\Omega\mu m^2$ |
| C2 | 80 m$\Omega\mu m^2$ |
| C3 | 180 m$\Omega\mu m^2$ |

Since the resistance adjustment layer 30 was somewhat thick, the device resistivity AR of the element C1 using GaAs was as high as approximately 30 $\Omega\mu m^2$. In contrast, in the elements C2 and C3 using semimetals, the device resistivity AR was approximately 100 m$\Omega\mu m^2$, which is a favorable value. To obtain the device resistivity higher than those of C2 and C3, it is effective to increase the thickness of the semimetal layer used as the resistance adjustment layer 30, or use a material having a relatively high specific resistance (such as $MnSi_{1.72}$, $CrSi_2$, $(Cr_{1-x}Mn_x)Si_2$, or the like).

Figure 7:
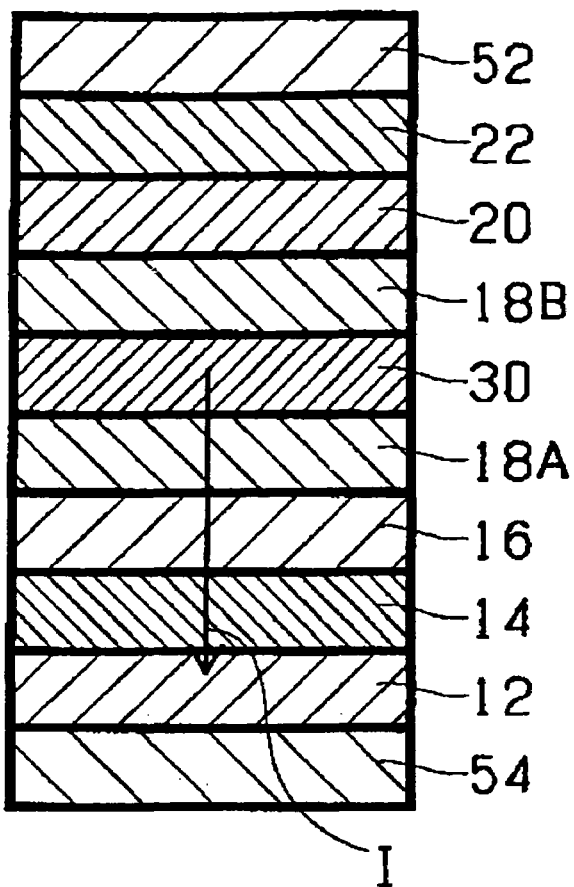
FIG. 7 is a schematic diagram that shows a modification of the third embodiment.

FIG. 7 is a schematic diagram that shows a modification of the third embodiment. Here again, some of components that are common to those of FIGS. 1 to 6 are labeled with common reference numerals, and their detailed explanation is omitted here.

In this modification, the resistance adjustment layer 30 is inserted in the nonmagnetic intermediate layer 18. That is, formed on the lower electrode 54 are the base layer 12, antiferromagnetic layer 14, pinned layer 16, first nonmagnetic intermediate layer 18A, resistance adjustment layer 30, second nonmagnetic intermediate layer 30B, free layer 20, protective layer 22, and upper electrode 52 in this order. This structure inserting the resistance adjustment layer 30 in the nonmagnetic intermediate layer 18 also ensures the same effect. Additionally, this structure need not increase the thickness of the resistance adjustment layer 30, and permits it to be sufficiently thinned in accordance with its material. Therefore, this structure is advantageous for adjusting the device resistivity.

Heretofore, the first to third embodiments have been explained in conjunction with specific examples. These specific examples, however, should not be construed to limit the invention.

For example, in any of the structures explained above, the same effects can be obtained even when reversing the order of stacking the respective layers.

Figure 8:
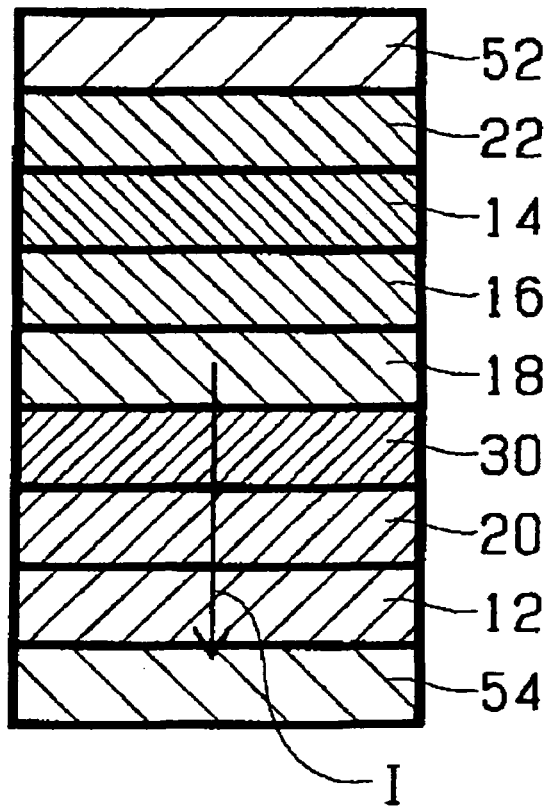
FIG. 8 is a schematic diagram that shows a cross-sectional structure of a magnetoresistive effect element in which a magnetization-free layer 20 is located lower in an embodiment of the invention.
Figure 9:
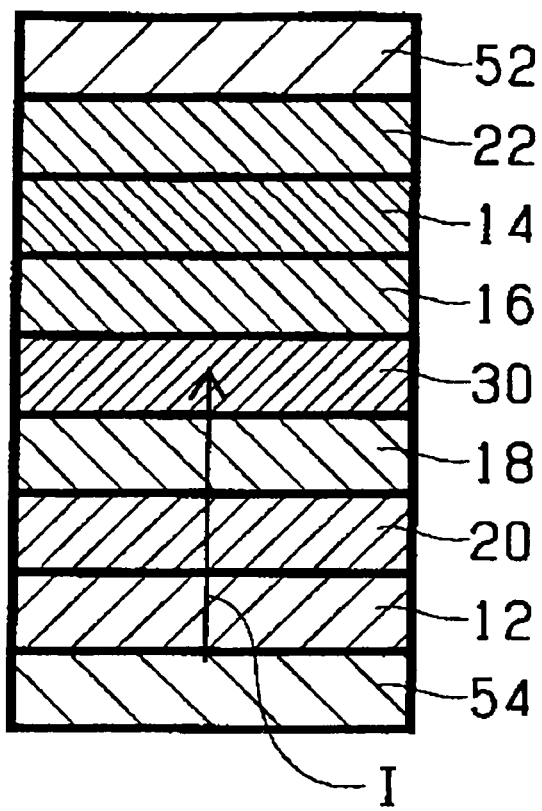
FIG. 9 is a schematic diagram that shows a cross-sectional structure of a magnetoresistive effect element in which a magnetization-free layer 20 is located lower in an embodiment of the invention.

FIGS. 8 and 9 are schematic diagrams that show cross-sectional structures of magnetoresistive effect elements in which the magnetization-free layer 20 is located lower. Here again, some of components that are common to those of FIGS. 1 to 7 are labeled with common reference numerals, and their detailed explanation is omitted here.

The structures shown in FIGS. 8 and 9 correspond to the first embodiment, but structures having a reversed order of lamination of respective layers can be similarly realized by modifying the second and third embodiments, and the same effects can be obtained therefrom.

Also regarding the position for inserting the resistance adjustment layer 30 in the spin valve structure, the invention contemplates other various structures in addition to those illustrated.

Figure 10:
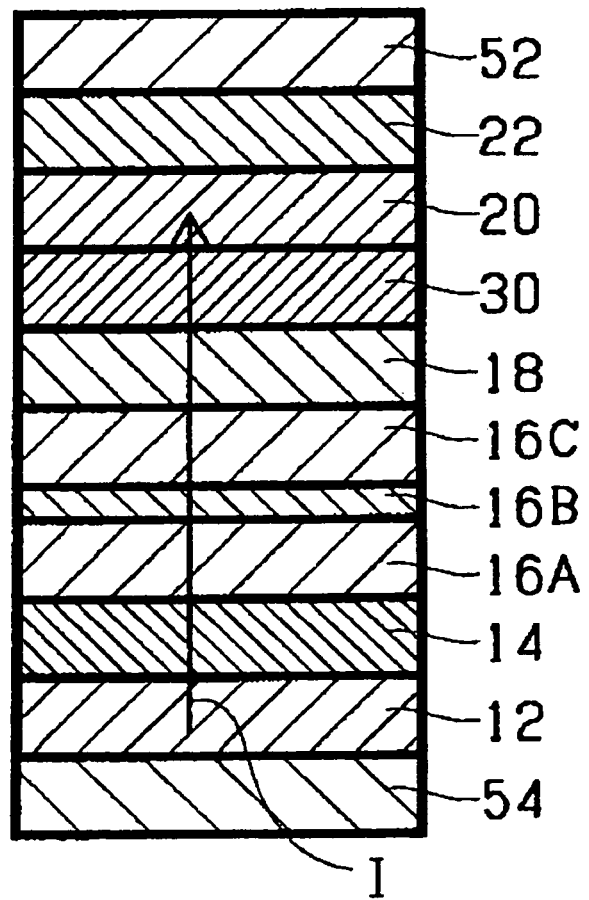
FIG. 10 is a schematic diagram that shows a modification of the synthetic type magnetoresistive effect element of FIG. 2.

The structure shown in FIG. 10 corresponds to the synthetic type element shown in FIG. 2, but it is reversed in positional relation between the resistance adjustment layer 30 and the nonmagnetic intermediate layer 18. This type of structure is also envisaged in the present invention, and ensures the same effects as those explained above.

The invention is also applicable to structures in which the pinned layer or the free layer has a multi-layered structure, and ensures the same effects.

Figure 11:
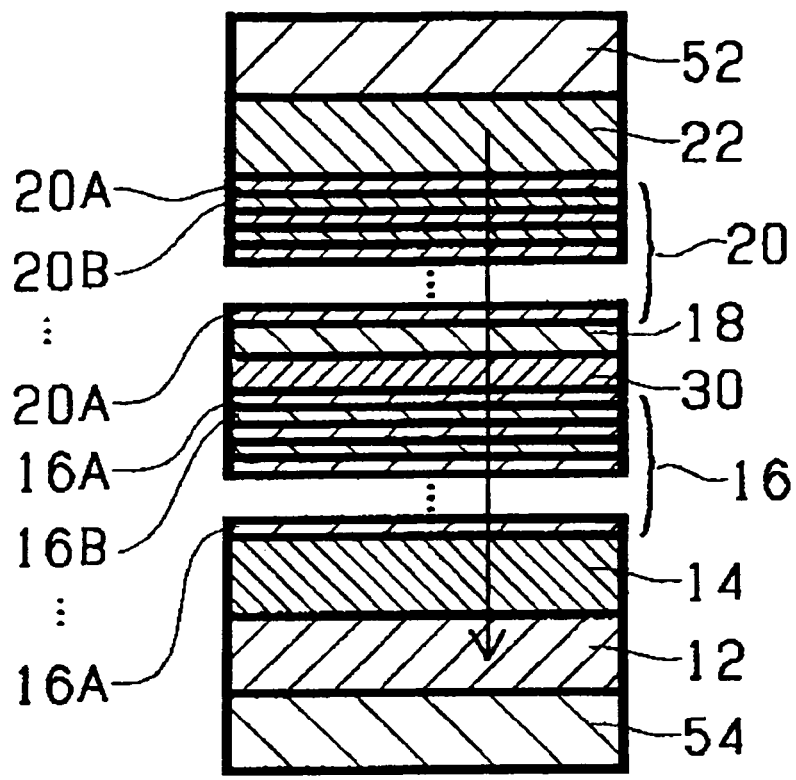
FIG. 11 is a schematic diagram that shows a cross-sectional structure of a magnetoresistive effect element employing a multi-layered structure.

FIG. 11 is a schematic diagram that shows a cross-sectional structure of a magnetoresistive effect element employing a multi-layered structure. In the magnetoresistive effect element shown here, the pinned layer 16 and the free layer 20 are multi-layered films made by alternately stacking ferromagnetic layers 16A (20A) and interposed layers 16B (20B).

The interposed layers 16B (20B) may be made of a nonmagnetic metal, kind of ferromagnetic metal different from that of the ferromagnetic layer 16A (20A), semiconductor or semimetal.

Nonmagnetic metals appropriate for this purpose are Cu, Sc, Ti, Mn, Cu Zn, Zr and Hf, for example.

Different kinds of ferromagnetic metals usable for this purpose are, for example, ferromagnetic alloys containing at least one of Fe, Co, Ni, Cr and Mn as their major components.

Semiconductors appropriate for this purpose are, for example, Ge, III-V compounds and II-VI compounds.

Semimetals usable here are, for example, graphite, As, Sb, Bi, HgTe, HgSe, CoSi, $Co_{1-x}Fe_xSi$, $Co_{1-x}Ni_xSi$, $Co_{1-x}Mn_xSi$, $Co_{1-x}Cr_xSi$ and FeSi.

These kinds of multi-layered structures are applicable to all structures already explained as the first to third embodiments, and the invention contemplates them all.

Furthermore, the invention contemplates magnetoresistive effect elements having oxide layers as well.

Figure 12:
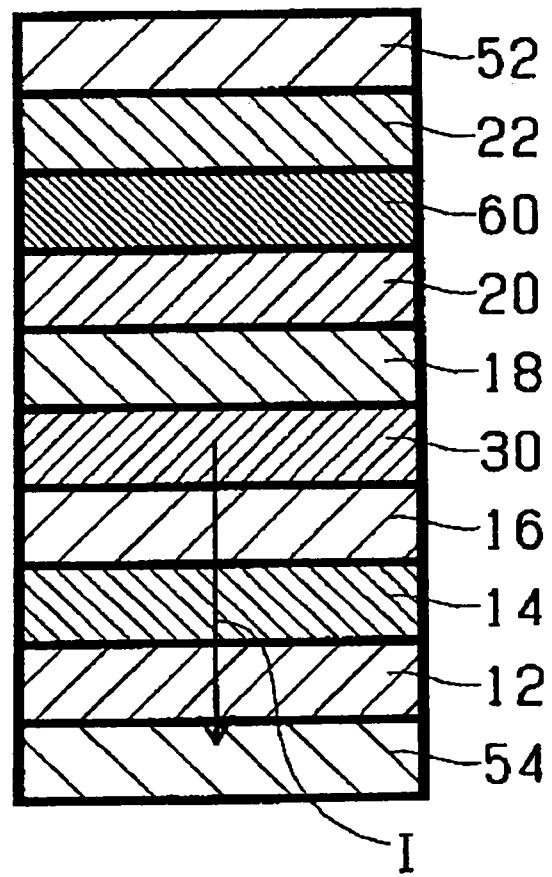
FIG. 12 is a schematic diagram that shows a cross-sectional structure of a magnetoresistive effect element including an oxide layer 60 between the free layer 20 and a protective layer 22.

FIG. 12 is a schematic diagram that shows a cross-sectional structure of a magnetoresistive effect element including an oxide layer 60 between the free layer 20 and the protective layer 22.

Figure 13:
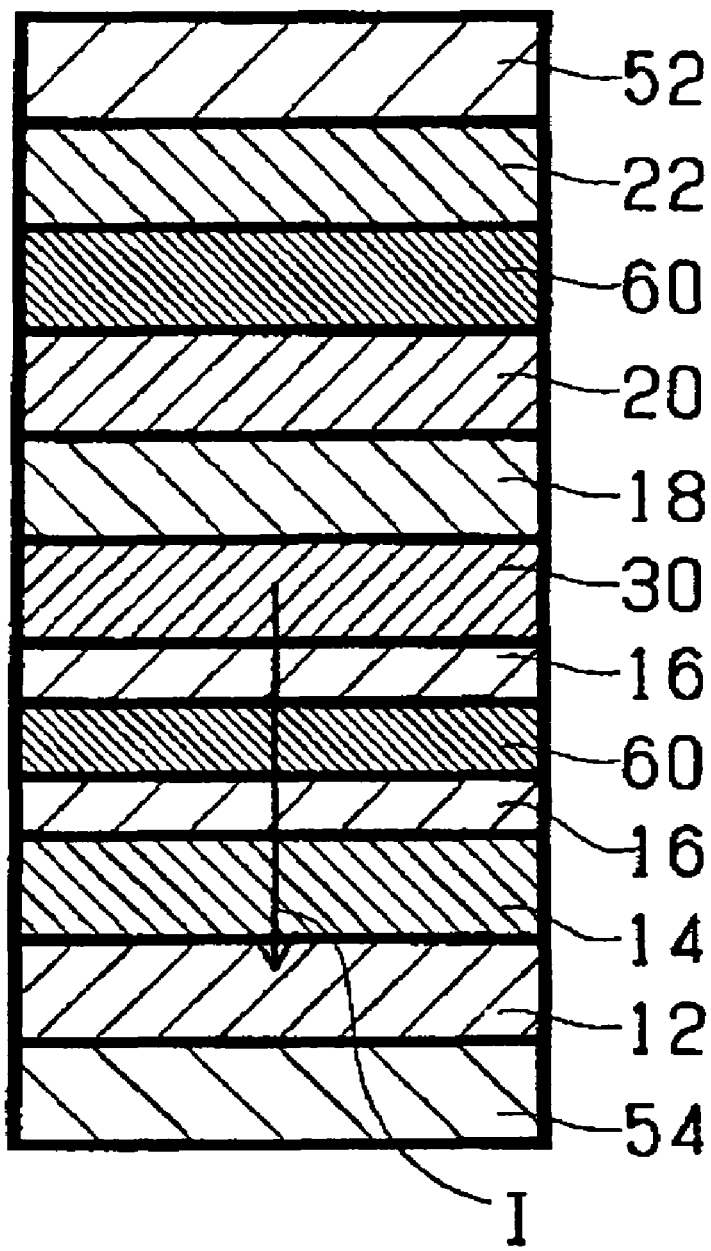
FIG. 13 is a schematic diagram that shows a cross-sectional structure of a magnetoresistive effect element having the oxide film 60 inserted in a pinned layer 16.

FIG. 13 is a schematic diagram that shows a cross-sectional structure of a magnetoresistive effect element having the oxide film 60 inserted in the pinned layer 16.

In these structures, the oxide layer 60 includes a local portion that serves as a path of a current when viewed in parallel to the film plane. For example, the oxide layer 60 may have a current path like a pinhole, or may be a continuous film having a region locally changed in composition to exhibit a high conductivity. By using this kind of oxide layer 60, a current path confining effect is obtained, and the magnetic flux efficiency and sensitivity are improved more.

Also when the oxide layer 60 is inserted in the nonmagnetic intermediate layer 18, substantially the same current path confining effect is obtained.

Furthermore, in any of the above-indicated structures, if one or both of the pinned layer 16 and the free layer 20 is made of a half-metal that does not substantially contribute to conduction of electrons unless they are up-spin electrons, then the magnetoresistive effect is enhanced, and the magnetoresistance variable amount increases.

Also regarding the material of the free layer, the invention is not limited to those specific examples.

Taking a part of the result of trial preparation and evaluation made by the Inventors about materials of the free layer as an example, explanation will be made below.

Based on the structure magnetoresistive effect element A3 explained in conjunction with the first embodiment, samples D1 through D3 different in material and thickness of the free layer 20 and the pinned layer 16C were prepared and evaluated.

Materials and thicknesses of respective layers forming the prepared magnetoresistive effect elements are listed below.

| <Magnetoresistive effect element A3> | | |
|---|---|---|
| Protective layer 22 | Ta | (5 nm) |
| Second free layer 20 | $(Co_{86}Fe_{14})_{82}Ni_{18}$ | (4 nm) |
| First free layer 20 | $(Fe_{50}Co_{50})_{95}Cu_5$ | (2 nm) |
| Nonmagnetic intermediate layer 18 | Cu | (3 nm) |
| Pinned layer 16C | $(Fe_{50}Co_{50})_{95}Cu_5$ | (3 nm) |
| Pinned layer 16B | Ru | (1 nm) |
| Pinned layer 16A | $Co_{90}Fe_{10}$ | (3 nm) |
| Antiferromagnetic layer 14 | PtMn | (15 nm) |
| Second base layer 12 | Ru | (2 nm) |
| First base layer 12 | Ta | (5 nm) |

The magnetoresistive effect element A3 was changed in material and thickness of the first and second free layer 20 and only the pinned layer 16C as follows.

| (Magnetoresistive effect element D1) | | |
|---|---|---|
| Second free layer 20 | $Fe_{13}Co_{20}Ni_{67}$ | (4 nm) |
| First free layer 20 | $(Fe_{50}Co_{50})_{95}Cu_5$ | (2 nm) |
| Pinned layer 16C | $(Fe_{50}Co_{50})_{95}Cu_5$ | (3 nm) |
| (Magnetoresistive effect element D2) | | |
| Second free layer 20 | $Fe_{13}Co_{20}Ni_{67}$ | (5.5 nm) |
| First free layer 20 | $(Fe_{50}Co_{50})_{95}Cu_5$ | (0.5 nm) |
| Pinned layer 16C | $(Fe_{50}Co_{50})_{95}Cu_5$ | (3 nm) |
| (Magnetoresistive effect element D3) | | |
| Second free layer 20 | $Fe_{13}Co_{20}Ni_{67}$ | (5.5 nm) |
| First free layer 20 | $(Fe_{50}Co_{50})_{95}Cu_5$ | (0.5 nm) |
| Pinned layer 16C | $(Fe_{50}Co_{50})_{95}Cu_5$ | (0.5 nm) |
| Pinned layer 16C | $Ni_{80}Fe_{20}$ | (2.5 nm) |

In the magnetoresistive effect element D3, the pinned layer 16C was prepared in form of a two-layered structure, locating the $(Fe_{50}CO_{50})_{95}Cu_5$ nearer to the free layer 20.

As a result of measurement of the area resistivity variable amount AΔR of each magnetoresistive effect element, the following values were obtained.

| Magnetoresistive effect element | AΔR |
|---|---|
| A3 | 125 mΩμm$^2$ |
| D1 | 120 mΩμm$^2$ |
| D2 | 118 mΩμm$^2$ |
| D3 | 110 mΩμm$^2$ |

When the element D1 simply changed in material of the first free layer to $Fe_{13}Co_{20}Ni_{67}$ with the element A3, AΔR is 125 mΩμm$^2$ in A3 and 120 mΩμm$^2$ in D1, and their difference is not large.

However, the change of the first free layer to $Fe_{13}CO_{20}Ni_{67}$ leads to a change of magnetization Mst (saturated magnetization Ms×thickness t) of the free layer from 11.8 nmT of A3 to 9.4 nmT of D1. Moreover, when the ratio of thicknesses was changed, magnetization Mst decreased to 7.75 nmT in the elements D2 and D3. The fact that Mst of the free layer is small demonstrates an improvement of the sensitivity to the external magnetic field.

Attention is called to the elements D1 and D2 for comparing the effects of changing the ratio between the first and second free layers.

In the magnetoresistive effect elements explained above, materials typically used in almost all layers have fcc (face-centered cubic) crystal structures. From the viewpoint of the crystal property, the layers are preferably uniform in crystal structure.

When the $(Fe_{50}Co_{50})_{95}Cu_5$ film having the bcc (body-centered cubic) crystal structure was as thin as 0.5 nm, the coercive force Hc of the free layer could be decreased from 200 Oe (oersteds) of the element D1 to 13 Oe of the element D2. At that time, AΔR was 120 mΩμm$^2$ in the element D1 and 118 mΩμm$^2$ in the element D2, and there was not a large difference here again. This demonstrates that it is important that the spin polarizability is high at the interface between the nonmagnetic portion and the ferromagnetic portion.

Taking this result into consideration, it was assumed that a high output would be obtained also by configuring the pinned layer to include $(Fe_{50}Co_{50})_{95}Cu_5$ only along the interface portion thereof. Actually, AΔR was approximately 110 mΩμm$^2$ in the element D3. In the element D3, since the ratio of bcc occupied only a small part of the entire film, the crystal property of the film was improved, and the coercive force Hc of the free layer was further reduced to 8 Oe.

As explained above, any of the embodiments of the invention can improve the soft-magnetic property of the free layer, decrease the coercive force and thereby ensure a high output by appropriately adjusting the materials and thicknesses of the magnetization free layer and the magnetization-pinned layer.

Next explained is the eighth embodiment of the invention, which is a magnetic recording apparatus having inboard any of the magnetoresistive effect element explained with reference to FIGS. 1 through 13.

Figure 14:
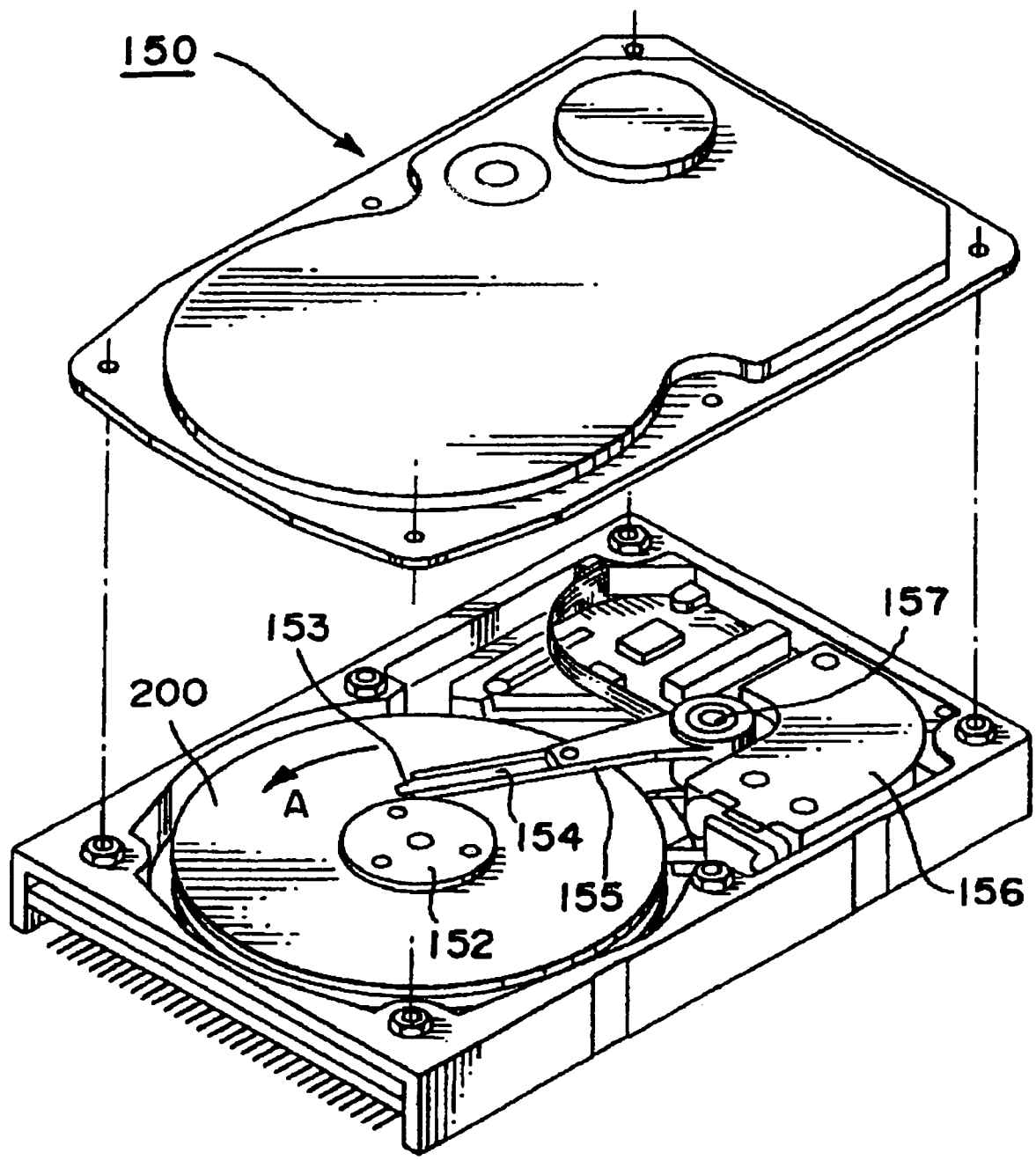
FIG. 14 is a perspective view that shows outline configuration of this kind of magnetic recording apparatus.

FIG. 14 is a perspective view that shows outline configuration of this kind of magnetic recording apparatus. The magnetic recording apparatus 150 shown here is of a type using a rotary actuator. A magnetic recording medium disk 200 is mounted on a spindle 152 and rotated in the arrow A direction by a motor, not shown, which is responsive to a control signal from a controller of a driving mechanism, not shown. The magnetic recording apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistive effect element or magnetic head, for example, according to one of the foregoing embodiments of the invention, near the distal end thereof.

Once the medium disk 200 rotates, the medium-faced surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator arm 155 is supported by ball bearings, not shown, which are located at upper and lower two positions of the spindle 157 and driven by the voice coil motor 156 for rotating, sliding movements.

Figure 15:
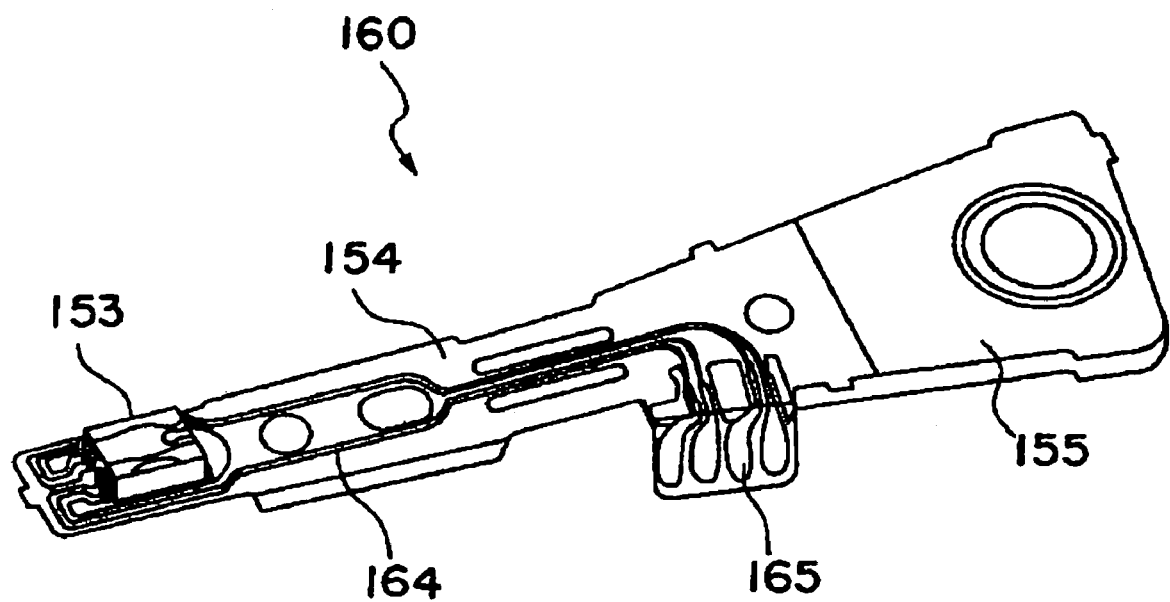
FIG. 15 is a perspective view of a magnetic head assembly at the distal end from an actuator arm 155 involved, which is viewed from the disk.

FIG. 15 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistive effect element as explained with reference to FIGS. 1 through 13 is attached. The suspension 154 has a lead 164 for writing and reading signals, and the lead line 164 is connected to electrodes of the magnetic head incorporated in the head slider 153. Numeral 165 in FIG. 15 denotes an electrode pad of the magnetic head assembly 160.

In this embodiment, one of the magnetoresistive effect elements already explained in conjunction with the aforementioned embodiments is used as the magnetoresistive effect element, information magnetically recorded on the medium disk 200 under a higher recording density than before can be read reliably.

Heretofore, some embodiments of the invention have been explained with reference to specific examples. However, the invention is not limited to these specific examples.

For example, as to laminating configuration of the components composing the magnetiresistive effect element, such as the specific size, shape or positional relationship of the electrode, bias magnetic field applying film or insulating layer can be selected from the known art. The invention encompasses any such changes by persons skilled in the art provided they attain the effects of respective embodiments of the invention.

The each components of the magnetoresistive effect element such as the antiferromagnetic layer, magnetically pinned layer, nonmagnetic spacer layer or magnetically free layer can be made of a single layer or made of multiplayer including a plurality of films.

When the magnetoresistive effect element according to the present invention is applied to a reproducing head, a recording-reproducing integrated magnetic head may be realized by combining a recording head therewith.

Further, the magnetic reproducing apparatus according to the present invention may be of a fixed type in which specific magnetic recording medium is permanently installed, while it may be of a removable type in which the magnetic recording medium can be replaced easily.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistive effect element comprising:
a magnetoresistive effect film including a magnetization-pinned layer having a magnetic film whose direction of magnetization is pinned substantially in one direction, a magnetization free layer having a magnetic film whose direction of magnetization varies in response to an external magnetic field, a nonmagnetic metallic intermediate layer interposed between said magnetization-pinned layer and said magnetization free layer, and a resistance adjustment layer interposed between said magnetization-pinned layer and said magnetization free layer and containing as its major component one material selected from the group consisting of graphite, As, Sb and Bi, wherein a specific resistance of the resistance adjustment layer ranges from 40 μΩcm to 1 mΩcm; and
a pair of electrodes electrically coupled to said magnetoresistive effect film to supply a sense current substantially vertically of the film plane of said magnetoresistive effect film.

2. A magnetoresistive effect element according to claim 1, wherein a thickness of said resistance adjustment layer is equal to or less than 1 nm.

3. A magnetoresistive effect element according to claim 1, wherein said resistance adjustment layer contains a quantity of conductive carriers not more than $10^{22}/cm^3$.

4. The magnetoresistive effect element according to claim 1, wherein the magnetization-pinned layer includes first and second ferromagnetic layers, and an anti-parallel coupling layer disposed between the first and second ferromagnetic layers, the anti-parallel coupling layer coupling the first and second ferromagnetic layers in an anti-parallel magnetization direction.

* * * * *